(12) United States Patent
Chang et al.

(10) Patent No.: US 7,253,758 B2
(45) Date of Patent: Aug. 7, 2007

(54) THIRD ORDER SIGMA-DELTA MODULATOR

(75) Inventors: Long-Xi Chang, Yilan (TW); Chia-Chun Hung, Taipei (TW)

(73) Assignee: Industrial Technology Research Institute, Chutung Hsinchu (TW)

( * ) Notice: Subject to any disclaimer, the term of this patent is extended or adjusted under 35 U.S.C. 154(b) by 0 days.

(21) Appl. No.: 11/185,287

(22) Filed: Jul. 20, 2005

(65) Prior Publication Data

US 2007/0018865 A1 Jan. 25, 2007

(51) Int. Cl.
*H03M 3/00* (2006.01)
(52) U.S. Cl. ...................................... 341/143
(58) Field of Classification Search ................ 341/144, 341/155, 120, 143, 163, 118
See application file for complete search history.

(56) References Cited

U.S. PATENT DOCUMENTS

| | | | |
|---|---|---|---|
| 5,757,300 A * | 5/1998 | Koilpillai et al. | 341/143 |
| 6,515,604 B2 * | 2/2003 | Delano | 341/143 |
| 6,587,063 B1 | 7/2003 | Su | |
| 6,697,000 B2 | 2/2004 | LeReverend et al. | |
| 6,954,159 B1 * | 10/2005 | Cooper et al. | 341/143 |
| 6,980,144 B1 * | 12/2005 | Maloberti et al. | 341/143 |
| 7,012,471 B2 * | 3/2006 | Lyden et al. | 331/16 |

* cited by examiner

*Primary Examiner*—Brian Young
(74) *Attorney, Agent, or Firm*—Ronald W. Burns; Akin Gump Strauss Hauer & Feld LLP (57) ABSTRACT

A third order sigma-delta modulator comprises a first summing unit for receiving an input signal, a first integrator network connected to an output of the first summing unit, a second integrator network for receiving an output of the first integrator network, a second summing unit connected to an output of the second integrator network, a third integrator network connected to an output of the second summing unit, and a feed-forward path from the output of the first integrator network to an input of the second summing unit.

44 Claims, 9 Drawing Sheets

FIG. 1A $$NTF = \frac{(Z-1)^3}{(Z-1)^3 + A3(Z-1)^2 + A1A3C1(Z-1) + A1A2A3}$$

THIRD ORDER SIGMA-DELTA MODULATOR

BACKGROUND OF THE INVENTION

1. Technical Field of the Invention

The present invention relates generally to a sigma-delta modulator, and more particularly, to a third order sigma-delta modulator having a feed-forward path.

2. Description of the Related Art

Sigma-delta modulators have a wide variety of applications, such as in hearing aids, cellular phones and other electronic apparatuses where conversion between audio and digital forms of signals are required. Third or higher order sigma-delta modulators have received much attention in recent years for applications required for low power consumption and high resolution, such as in voice IP and audio codec.

To characterize the sigma-delta modulators, two transfer functions are defined. They are the Signal Transfer Function (STF) and the Noise Transfer Function (NTF). The STF is defined as the transfer-function from an input of the modulator to an output, while the NTF is defined as the transfer-function from the quantization noise source to the output. As an example of a 1-bit, single loop sigma-delta modulator, it can be shown that the NTF is a high pass filter function while the STF is a low pass filter-function. That is, noise is suppressed at low frequencies while a low-frequency input signal is passed unaffected through the modulator. A subsequent filter, digital or analog, can then remove the high frequency noise thus leaving the low frequency part of the signal with an improved signal to noise plus distortion ratio (SNDR).

When designing sigma-delta modulators of a given order for use in low power or low voltage applications, it is important to suppress the noise level in order to assure stability of the modulator without adversely affecting the output swing of the modulator. It is therefore an object of the present invention to provide a sigma-delta modulator for low power and low voltage applications to ensure maximum SNDR and maximum stability with an acceptable application bandwidth.

BRIEF SUMMARY OF THE INVENTION

The present invention is directed to an improved third order sigma-delta modulator and a method that obviate one or more problems resulting from the limitations and disadvantages of the prior art.

In accordance with an embodiment of the present invention, there is provided a third order sigma-delta modulator that comprises a first summing unit for receiving an input signal, a first integrator network connected to an output of the first summing unit, a second integrator network for receiving an output of the first integrator network, a second summing unit connected to an output of the second integrator network, a third integrator network connected to an output of the second summing unit, and a feed-forward path from the output of the first integrator network to an input of the second summing unit.

Also in accordance with the present invention, there is provided a third order sigma-delta modulator that comprises a first summing unit for receiving an input signal, a first integrator network connected to an output of the first summing unit, a second integrator network for receiving an output of the first integrator network, a second summing unit connected to an output of the second integrator network, a third integrator network connected to an output of the second summing unit, a third summing unit connected to an output of the third integrator network, and a feed-forward path from the output of the second integrator network to an input of the third summing unit.

Further in accordance with the present invention, there is provided a third order sigma-delta modulator that comprises a first summing unit for receiving an input signal, a first integrator network connected to an output of the first summing unit, a second summing unit connected to an output of the first integrator network, a second integrator network connected to an output of the second summing unit, a third integrator network for receiving an output of the second integrator network, a third summing unit connected to an output of the third integrator network, and a feed-forward path from the output of the first integrator network to an input of the third summing unit.

Still in accordance with the present invention, there is provided a third order sigma-delta modulator that comprises a first summing unit for receiving an input signal, a first integrator network connected to an output of the first summing unit, a second summing unit connected to an output of the first integrator network, a second integrator network connected to an output of the second summing unit, a third summing unit connected to an output of the second integrator network, a third integrator network connected to an output of the third summing unit, and a feed-forward path from the output of the first summing unit to an input of the third summing unit.

Yet still in accordance with the present invention, there is provided a method for modulating an input signal to produce an output digital signal that comprises providing a first summing unit for receiving the input signal, connecting a first integrator network to an output of the first summing unit, providing a second integrator network for receiving an output of the first integrator network, connecting a second summing unit to an output of the second integrator network, connecting a third integrator network to an output of the second summing unit, and feeding forward a modulated signal at the output of the first integrator network to an input of the second summing unit.

Also in accordance with the present invention, there is provided a method for modulating an input signal to produce an output digital signal that comprises providing a first summing unit for receiving the input signal, connecting a first integrator network to an output of the first summing unit, providing a second integrator network for receiving an output of the first integrator network, connecting a second summing unit to an output of the second integrator network, connecting a third integrator network to an output of the second summing unit, connecting a third summing unit to an output of the third integrator network, and feeding forward a modulated signal at the output of the second integrator network to an input of the third summing unit.

Further in accordance with the present invention, there is provided a method for modulating an input signal to produce an output digital signal that comprises providing a first summing unit for receiving the input signal, connecting a first integrator network to an output of the first summing unit, connecting a second summing unit to an output of the first integrator network, connecting a second integrator network to an output of the second summing unit, providing a third integrator network for receiving an output of the second integrator network, connecting a third summing unit to an output of the third integrator network, and feeding forward a modulated signal at the output of the first integrator network to an input of the third summing unit.

Still in accordance with the present invention, there is provided a method for modulating an input signal to produce an output digital signal that comprises providing a first summing unit for receiving the input signal, connecting a first integrator network to an output of the first summing unit, connecting a second summing unit to an output of the first integrator network, connecting a second integrator network to an output of the second summing unit, connecting a third summing unit to an output of the second integrator network, connecting a third integrator network to an output of the third summing unit, and feeding forward a modulated signal at the output of the first summing unit to an input of the third summing unit.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1A:
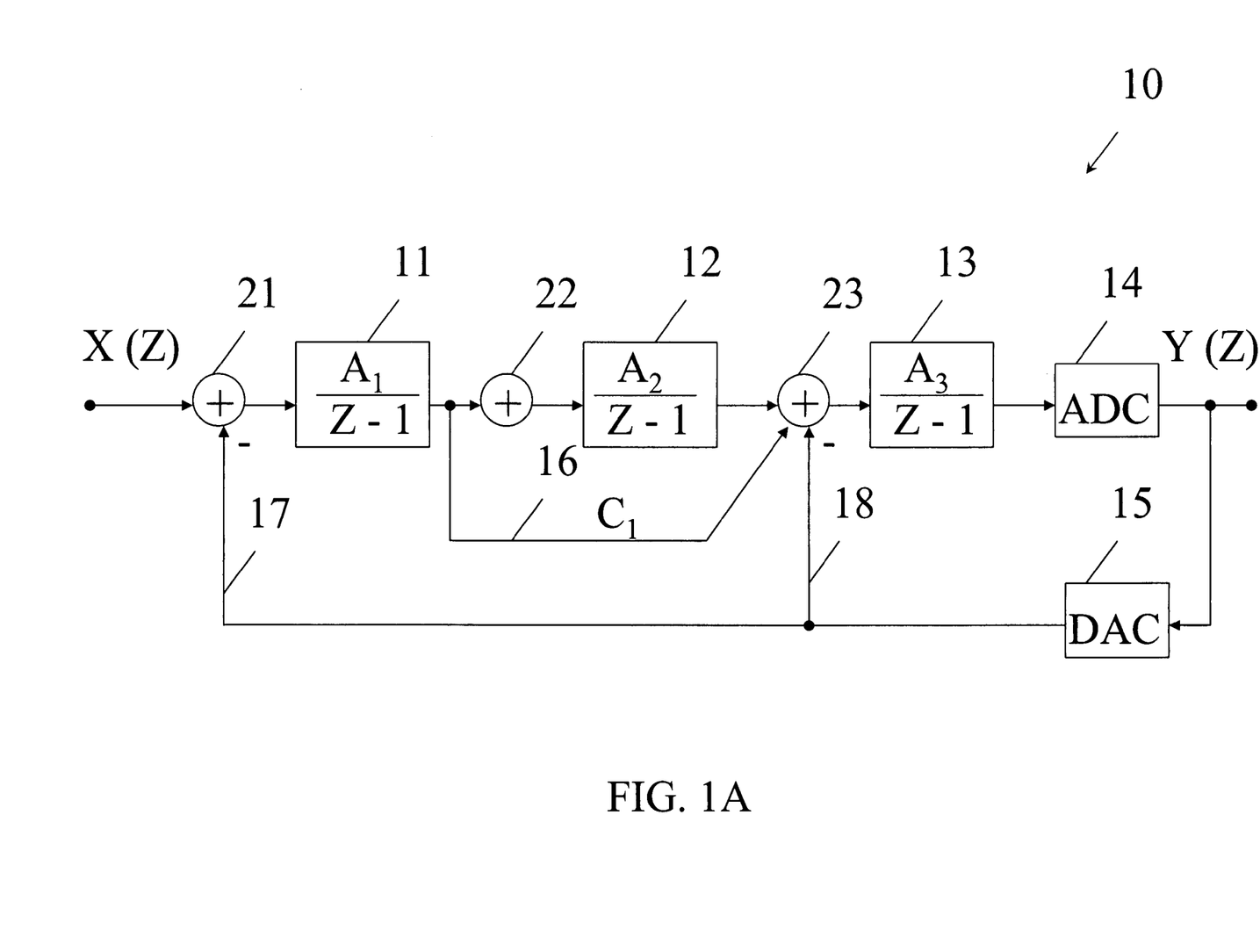
FIGS. 1A and 1B are block diagrams of a sigma-delta modulator in accordance with one embodiment of the present invention.
Figure 1B:
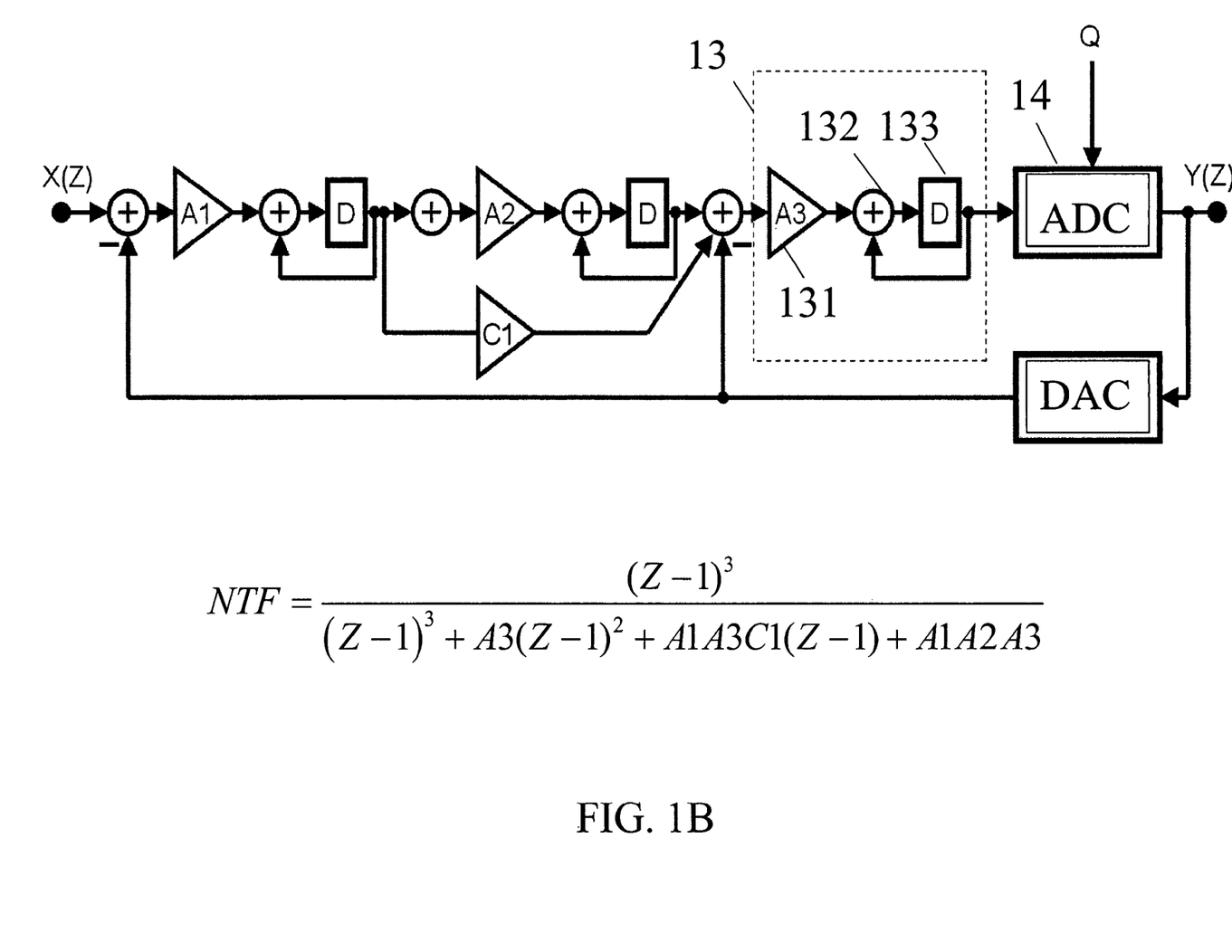

FIGS. 1A and 1B are block diagrams of a sigma-delta modulator 10 in accordance with one embodiment of the present invention. Referring to FIG. 1A, sigma-delta modulator 10 includes a first integrator network 11, a second integrator network 12, a third integrator network 13, a first summing unit 21, a second summing unit 22, a third summing unit 23, and a feed-forward path 16. First, second and third integrator networks 11, 12 and 13 are cascade-connected so that an integrator network output is connected to an input of a following integrator network. Furthermore, first, second and third integrator networks 11, 12 and 13 are connected to an output of first, second and third summing units 21, 22 and 23, respectively. First summing unit 21 receives an input analog signal X (Z) at a positive terminal. Second summing unit 22 is disposed between first integrator network 11 and second integrator network 12. Third summing unit 23 is disposed between second integrator network 12 and third integrator network 13. Feed-forward path 16, including a gain factor of $C_1$, connects an output of first integrator network 11 to a positive input of third summing unit 23.

Sigma-delta modulator 10 further includes an analog-to-digital converter (ADC) 14 and a digital-to-analog converter (DAC) 15. ADC 14 receives an output of third integrator network 23 and produces an output digital signal Y (Z). DAC 15 converts the digital signal Y (Z) into an analog signal. A first feedback path 17 connects the analog signal at an output of DAC 15 to a negative input of first summing unit 21. A second feedback path 18 connects the analog signal at the output of DAC 15 to a negative input of third summing unit 23. First and second feedback paths 17 and 18 are provided to decrease noise in sigma-delta modulator 10.

First, second and third integrator networks 11, 12 and 13 have a gain factor $A_1$, $A_2$ and $A_3$, respectively. Referring to FIG. 1B, as an example, third integrator network 13 includes a gain unit 131 including a gain factor $A_3$, a summing unit 132, and a delay unit 133. ADC 14 generates a quantization error Q due to its analog-to-digital operation. The function, operation and construction of the integrator networks 11, 12 and 13, ADC 14 and DAC 15 have been known to skilled persons in the art and are not discussed in detail.

The performance of sigma-delta modulator 10 may be determined by the noise transfer function (NTF) given below.

$$NTF=(Z-1)^3/((Z-1)^3+A_3(Z-1)^2+A_1A_3C_1(Z-1)+A_1A_2A_3)$$

wherein Z is a Z-transform variable, $A_1$, $A_2$ and $A_3$ are the gain factors of first, second and third integrator networks 11, 12 and 13, respectively, and $C_1$ is the gain factor of feed-forward path 16.

By adjusting the coefficients $A_1$, $A_2$, $A_3$ and $C_1$, a desired sigma-delta modulator is achieved. In one embodiment according to the present invention, the gain factors $A_1$, $A_2$, $A_3$ and $C_1$ are approximately 0.4, 0.1, 0.2 and 0.8, respectively.

Figure 1C:
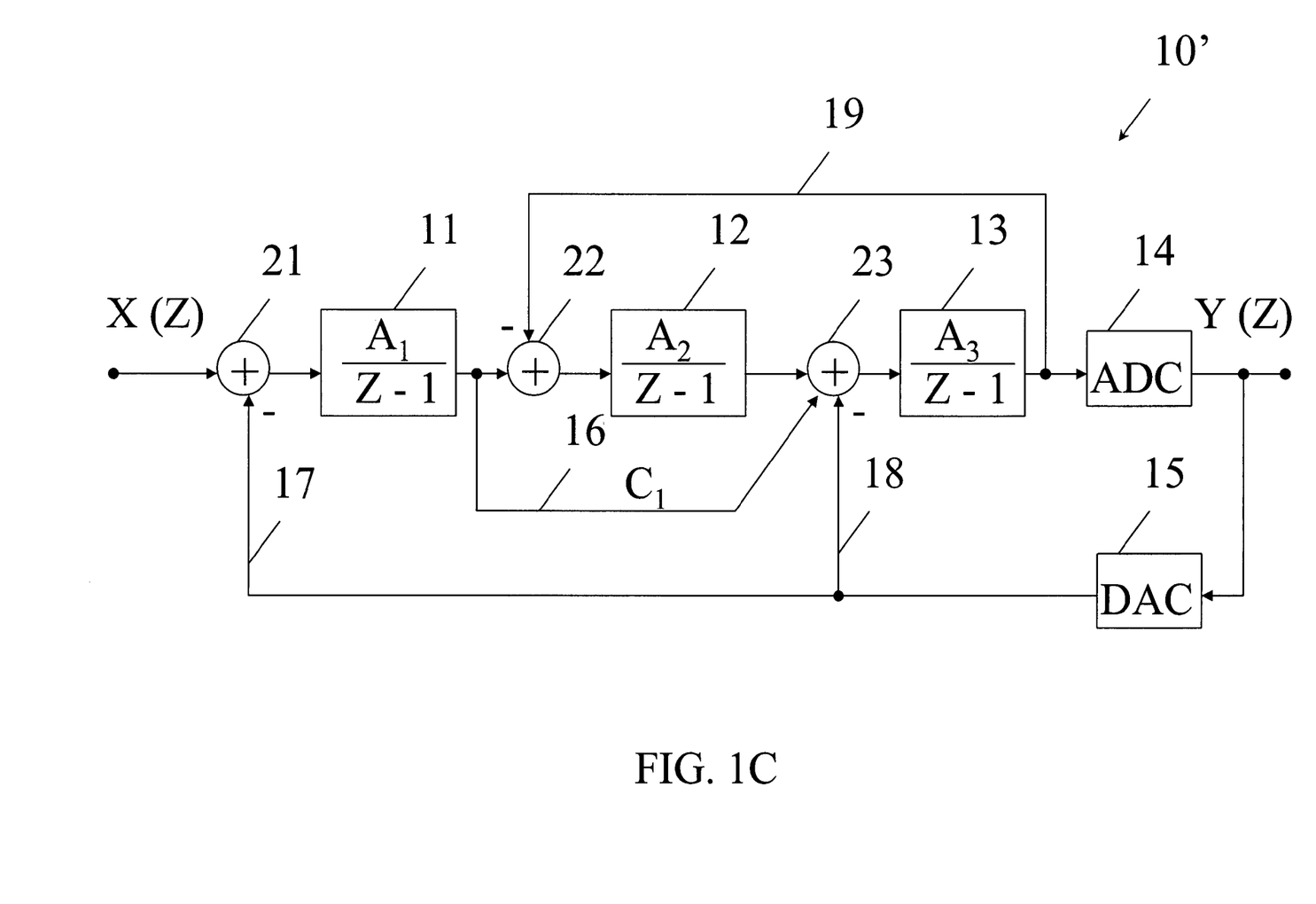
FIG. 1C is a block diagram of an alternative of the sigma-delta modulator shown in FIG. 1A.

In one embodiment according to the present invention, second summing unit 22 is eliminated to reduce circuit complexity. In that case, the output of first integrator network 11 is directly coupled to second integrator network 12. The elimination of second summing unit 22 does not adversely affect the performance of sigma-delta modulator 10. In other embodiments, a feedback path is connected to second summing unit 22 to improve the performance, as illustrated in FIG. 1C. FIG. 1C is a block diagram of an alternative of sigma-delta modulator 10 shown in FIG. 1A. Referring to FIG. 1C, a sigma-delta modulator 10' has a similar structure to sigma-delta modulator 10 except a third feedback path 19. Third feedback path 19, which connects the output of third integrator network 23 to a negative input of second summing unit 22, is provided to further decrease the noise in sigma-delta modulator 10'.

Figure 2:
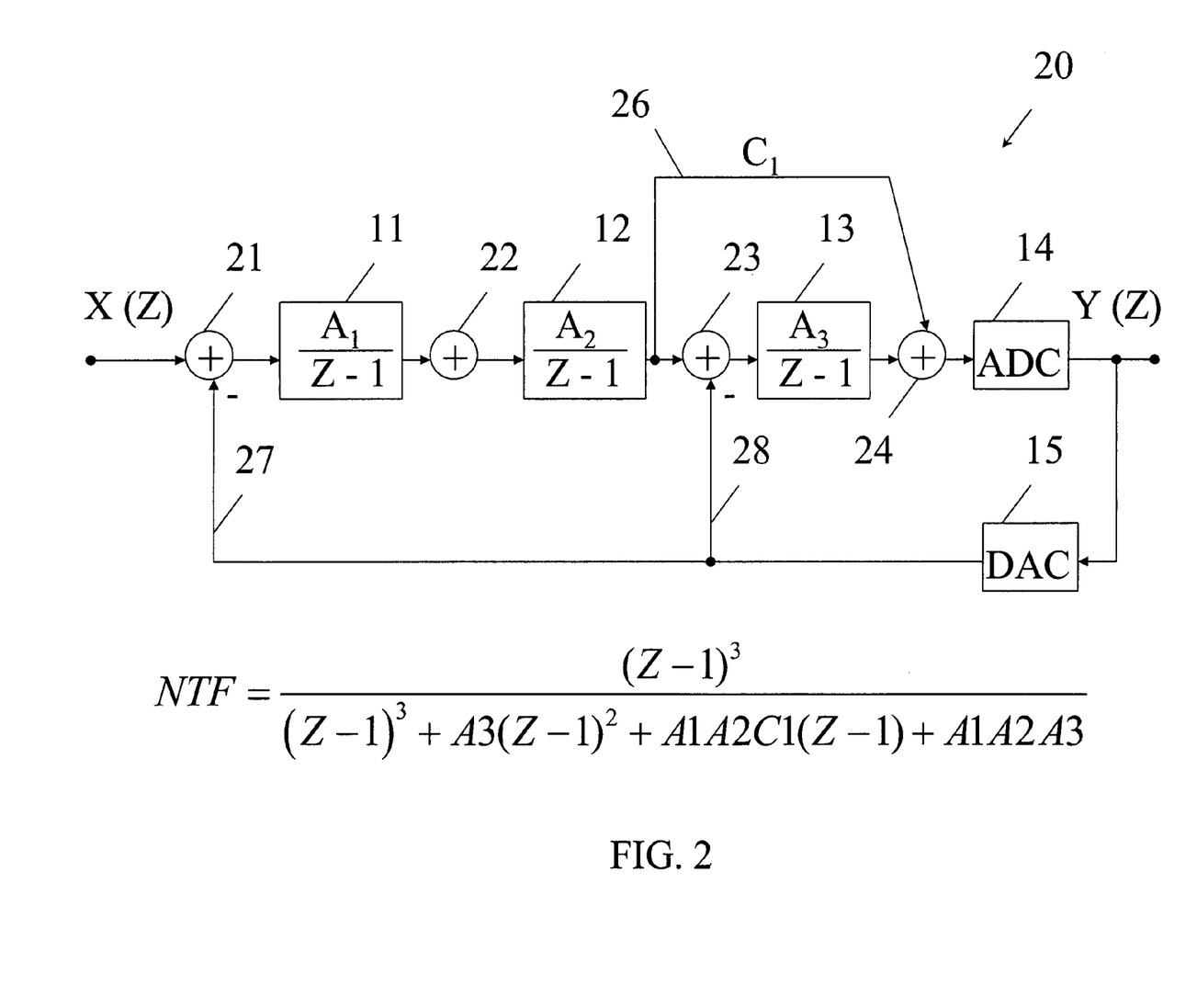
FIG. 2 is a block diagram of a sigma-delta modulator in accordance with another embodiment of the present invention.

FIG. 2 is a block diagram of a sigma-delta modulator 20 in accordance with another embodiment of the present invention. Referring to FIG. 2, sigma-delta modulator 20 has a similar structure to sigma-delta modulator 10 shown in FIG. 1A except a feed-forward path 26, which connects an output of second integrator network 12 to an input of a fourth summing unit 24. Fourth summing unit 24 is disposed between third integrator network 13 and ADC 14. In one embodiment according to the present invention, second summing unit 22 is eliminated to reduce circuit complexity. A first feedback path 27 connects an output of DAC 15 to a negative input of first summing unit 21. A second feedback path 28 connects the output of DAC 15 to a negative input of third summing unit 23. The NTF for sigma-delta modulator 20 is given below.

$$NTF=(Z-1)^3/((Z-1)^3+A_3(Z-1)^2+A_1A_2C_1(Z-1)+A_1A_2A_3)$$

wherein Z is a Z-transform variable, $A_1$, $A_2$ and $A_3$ are the gain factors of first, second and third integrator networks 11, 12 and 13, respectively, and $C_1$ is the gain factor of feed-forward path 26.

Figure 3:
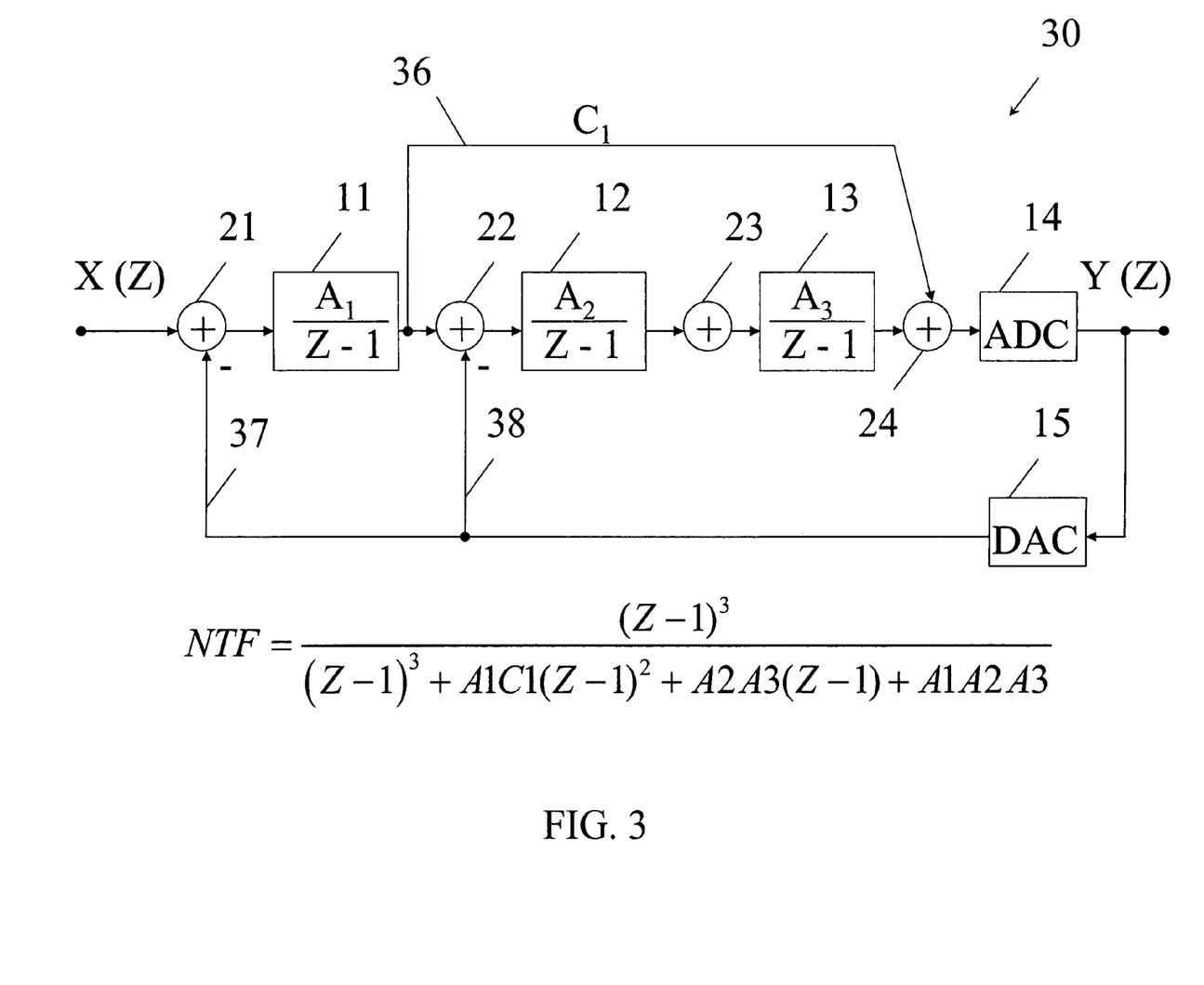
FIG. 3 is a block diagram of a sigma-delta modulator in accordance with yet another embodiment of the present invention.

FIG. 3 is a block diagram of a sigma-delta modulator 30 in accordance with yet another embodiment of the present invention. Referring to FIG. 3, sigma-delta modulator 30 has a similar structure to sigma-delta modulator 20 shown in FIG. 2 except a feed-forward path 36 and a second feedback path 38. Feed-forward path 36 connects an output of first integrator network 11 to an input of a fourth summing unit 24. In one embodiment according to the present invention, third summing unit 23 is eliminated to reduce circuit complexity. A first feedback path 37 connects an output of DAC 15 to a negative input of first summing unit 21. Second feedback path 38 connects the output of DAC 15 to a negative input of second summing unit 22. The NTF for sigma-delta modulator 30 is given below.

$$NTF=(Z-1)^3/((Z-1)^3+A_1C_1(Z-1)^2+A_2A_3(Z-1)+A_1A_2A_3)$$

wherein Z is a Z-transform variable, $A_1$, $A_2$ and $A_3$ are the gain factors of first, second and third integrator networks 11, 12 and 13, respectively, and $C_1$ is the gain factor of feed-forward path 36.

Figure 4:
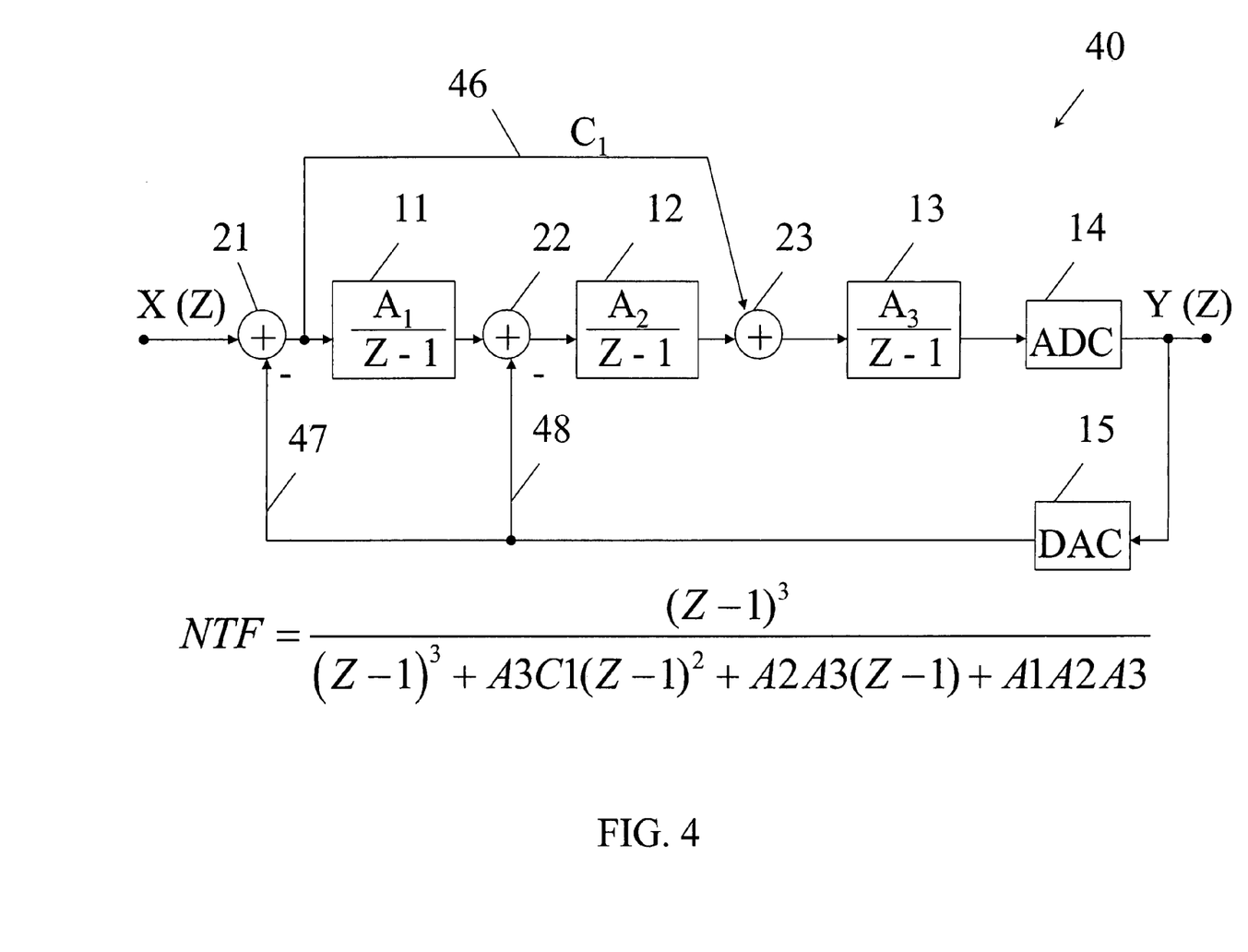
FIG. 4 is a block diagram of a sigma-delta modulator in accordance with still another embodiment of the present invention.

FIG. 4 is a block diagram of a sigma-delta modulator 40 in accordance with still another embodiment of the present invention. Referring to FIG. 4, sigma-delta modulator 40 has a similar structure to sigma-delta modulator 30 shown in FIG. 3 except a feed-forward path 46, which connects an output of first summing unit 21 to an input of a third summing unit 23. A first feedback path 47 connects an output of DAC 15 to a negative input of first summing unit 21. A second feedback path 48 connects the output of DAC 15 to a negative input of second summing unit 22. The NTF for sigma-delta modulator 40 is given below.

$$NTF=(Z-1)^3/((Z-1)^3+A_3C_1(Z-1)^2+A_2A_3(Z-1)+A_1A_2A_3)$$

wherein Z is a Z-transform variable, $A_1$, $A_2$ and $A_3$ are the gain factors of first, second and third integrator networks 11, 12 and 13, respectively, and $C_1$ is the gain factor of feed-forward path 46.

Figure 5A:
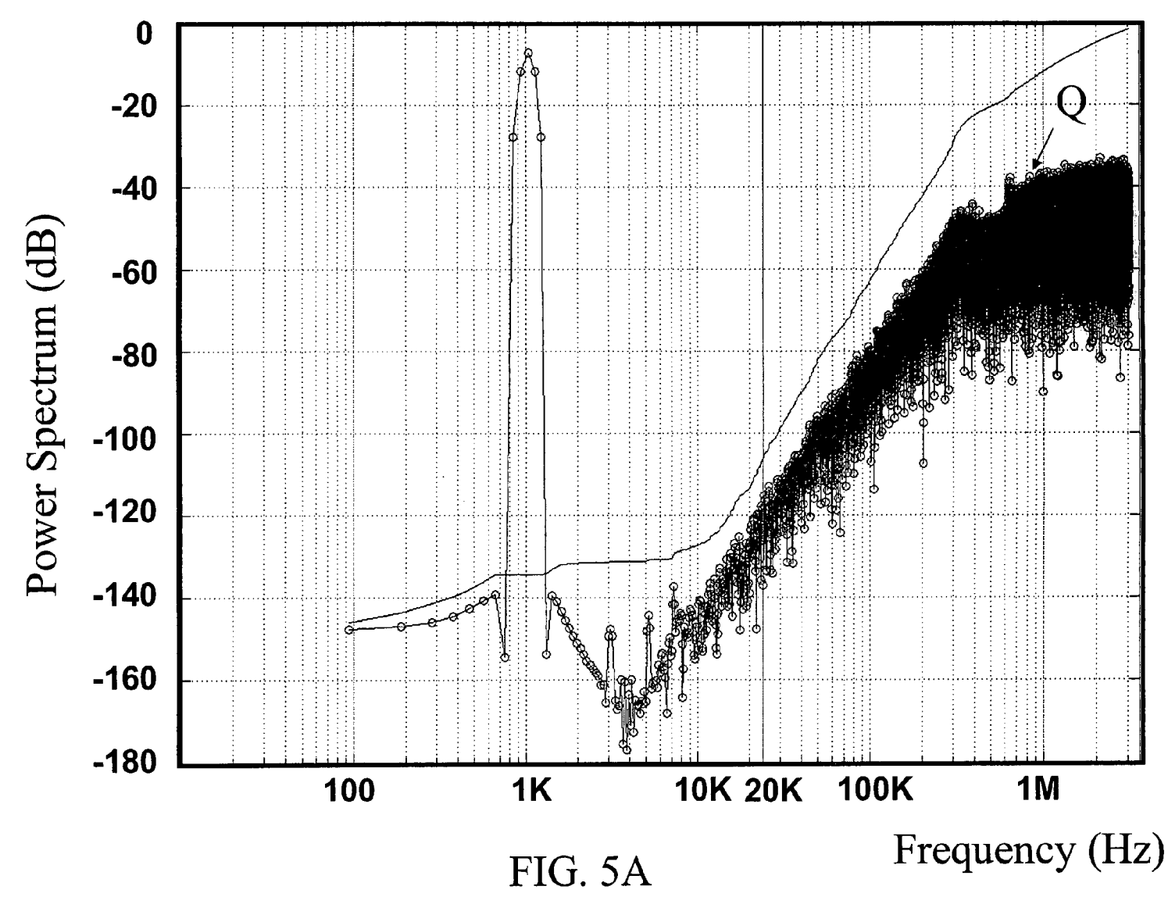
FIG. 5A is a power spectrum illustrating a simulation result of a sigma-delta modulator in accordance with one embodiment of the present invention.

FIG. 5A is a power spectrum illustrating a simulation result of a sigma-delta modulator in accordance with one embodiment of the present invention. In the simulation, a sine wave signal at a frequency of 1 KHz is modulated by a 1-bit, single loop sigma-delta modulator, for example, sigma-delta modulator 10 shown in FIG. 1A. Given a bandwidth of 20K, referring to FIG. 5, most of quantization error or noise Q, specifically, noise above the frequency of 20K, has been filtered out.

Figure 5B:
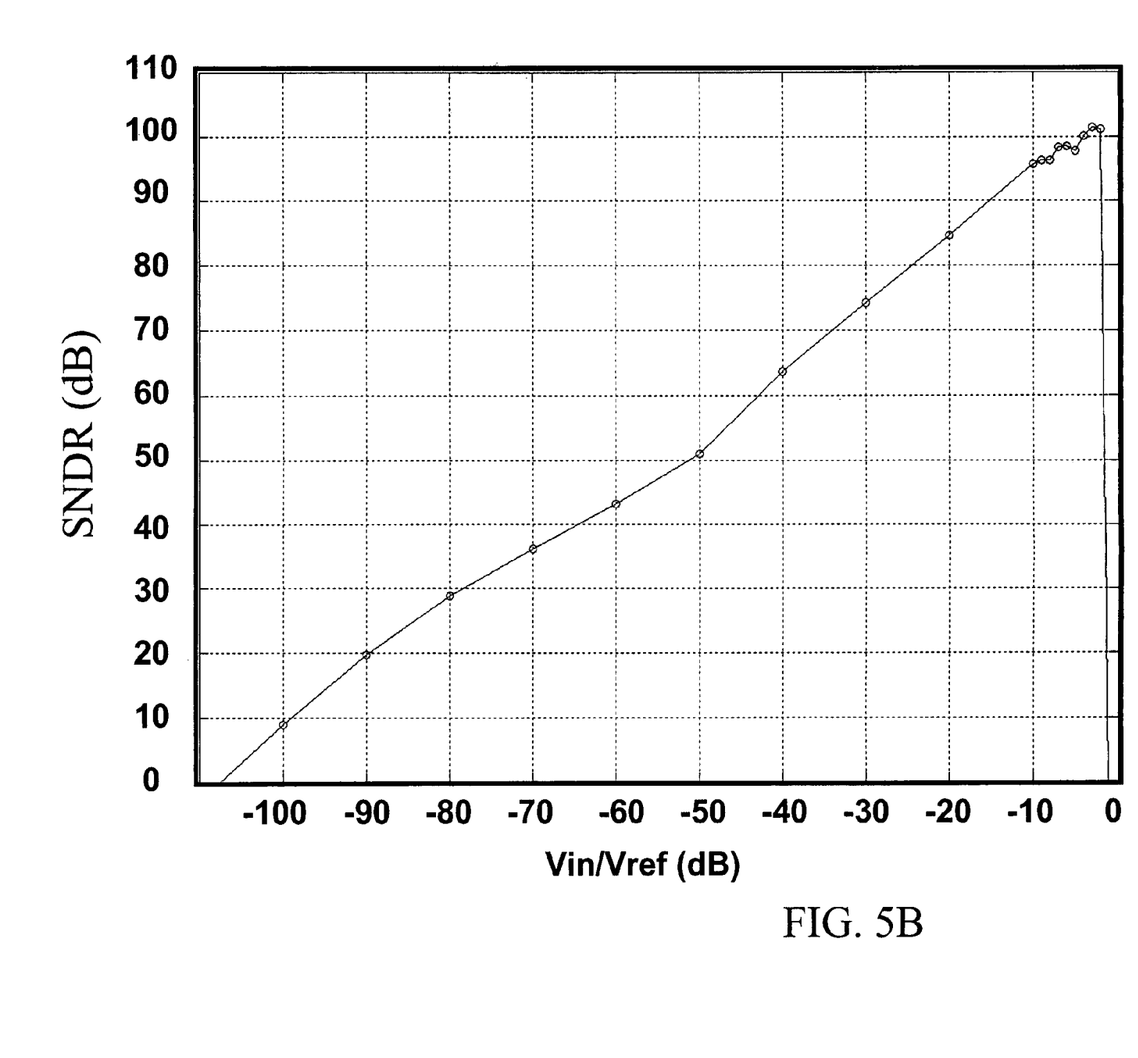
FIG. 5B is a spectrum illustrating the SNDR (signal to noise plus distortion ratio) of the sigma-delta modulator shown in FIG. 5A.

FIG. 5B is a spectrum illustrating the SNDR (signal to noise plus distortion ratio) of the sigma-delta modulator shown in FIG. 5A. SNDR is indicated as a measurement of converter linearity. Referring to FIG. 5B, the SNDR of the third order sigma-delta modulator is approximately 101 dB at a full swing of −2 dB.

Figure 6:
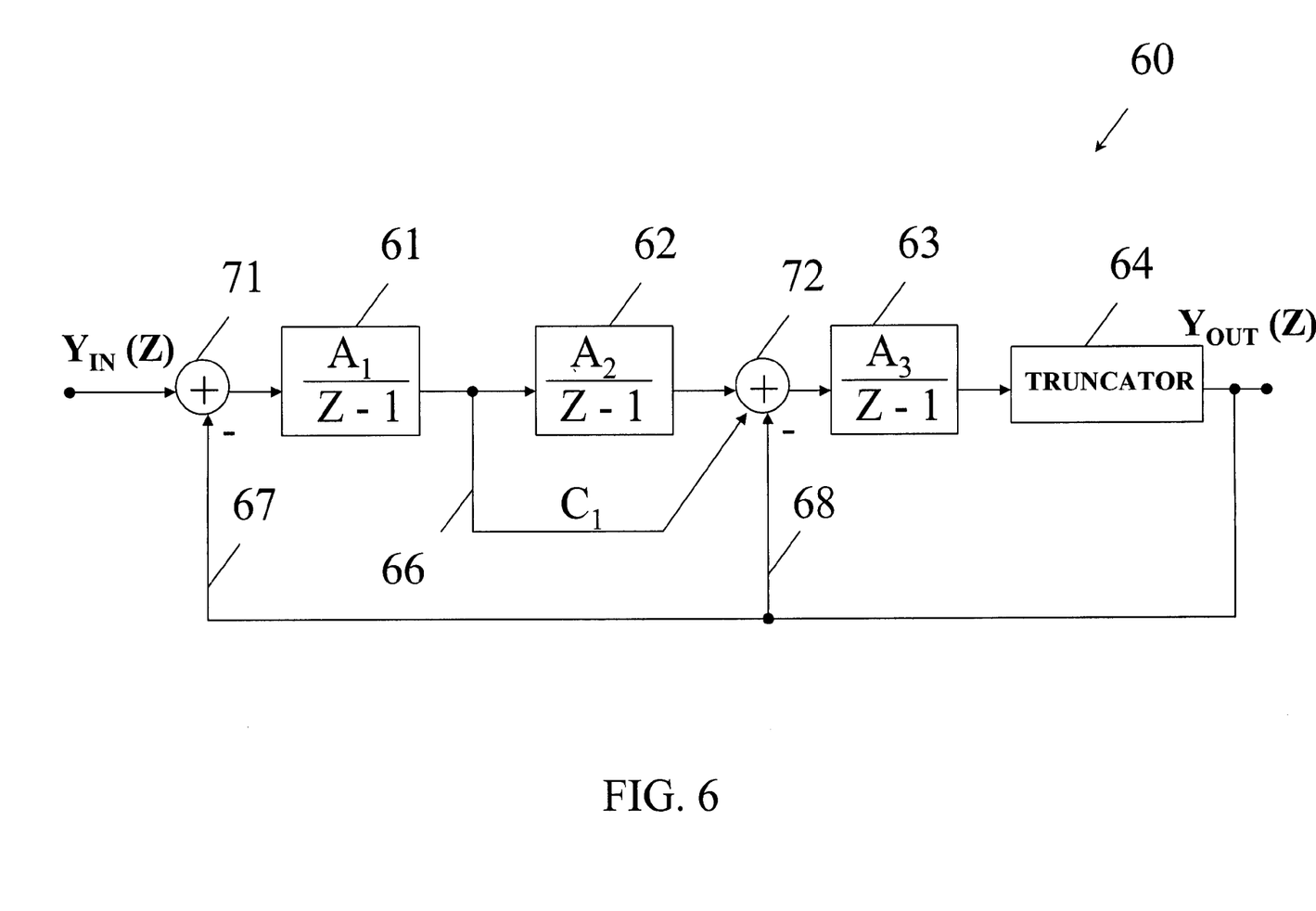
FIG. 6 is a block diagram of a sigma-delta modulator in accordance with still another embodiment of the present invention.

The above-mentioned embodiments illustrated by reference to FIGS. 1A, 1B, 2, 3 and 4 relate to the conversion of an analog input X (Z) into a digital output Y (Z). The present invention, however, is not limited to the analog-to-digital conversion, and may be used for digital-to-digital conversion as well. FIG. 6 is a block diagram of a sigma-delta modulator 60 in accordance with still another embodiment of the present invention. Referring to FIG. 6, sigma-delta modulator 60 includes a first integrator network 61, a second integrator network 62, a third integrator network 63, a truncator 64, a first summing unit 71, a second summing unit 72, and a feed-forward path 66. First, second and third integrator networks 61, 62 and 63 are cascade-connected so that an integrator network output is connected to an input of a following integrator network. First summing unit 71 receives an input digital signal $Y_{IN}$ (Z) at a positive input. Second summing unit 72 is disposed between second integrator network 62 and third integrator network 63. Feed-forward path 66, including a gain factor of $C_1$, connects an output of first integrator network 61 to a positive input of second summing unit 72.

Truncator 64 receives an output of third integrator network 63 and produces an output digital signal $Y_{OUT}$ (Z). A first feedback path 67 connects the digital signal $Y_{OUT}$ (Z) at an output of truncator 64 to a negative input of first summing unit 71. A second feedback path 68 connects the digital signal $Y_{OUT}$ (Z) at the output of truncator 64 to a negative input of second summing unit 72. The NTF for sigma-delta modulator 60 is given below.

$$NTF=(Z-1)^3/((Z-1)^3+A_3(Z-1)^2+A_1A_3C_1(Z-1)+A_1A_2A_3)$$

wherein Z is a Z-transform variable, $A_1$, $A_2$ and $A_3$ are the gain factors of first, second and third integrator networks 61, 62 and 63, respectively, and $C_1$ is the gain factor of feed-forward path 66.

It will be appreciated by those skilled in the art that changes could be made to the embodiments described above without departing from the broad inventive concept thereof. For example, sigma-delta modulators 20, 30 and 40 respectively shown in FIGS. 2, 3 and 4 for analog-to-digital conversion may be modified for use in digital-to-digital conversion, as the example of sigma-delta modulator 60 shown in FIG. 6. It is understood, therefore, that this invention is not limited to the particular embodiments disclosed, but it is intended to cover modifications within the spirit and scope of the present invention as defined by the appended claims.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

We claim:

1. A third order sigma-delta modulator, comprising:
   a first summing unit for receiving an input signal;
   a first integrator network connected to an output of the first summing unit;
   a second integrator network for receiving an output of the first integrator network;
   a second summing unit connected to an output of the second integrator network;
   a third integrator network connected to an output of the second summing unit; and
   a feed-forward path from the output of the first integrator network to an input of the second summing unit.

2. The modulator of claim 1, further comprising one of an analog-to-digital converter (ADC) or a truncator for receiving an output of the third integrator network.

3. The modulator of claim 2, further comprising a digital-to-analog converter (DAC) for receiving an output of the ADC.

4. The modulator of claim 2, further comprising a feedback path connected between an output of the one of ADC or truncator and an input of the first summing unit.

5. The modulator of claim 2, further comprising a feedback path connected between an output of the one of ADC or truncator and another input of the second summing unit.

6. The modulator of claim 2, further comprising a third summing unit connected between the first integrator network and the second integrator network.

7. The modulator of claim 6, further comprising a feedback path from an output of the third integrator network to an input of the third summing unit.

8. A third order sigma-delta modulator, comprising:
   a first summing unit for receiving an input signal;
   a first integrator network connected to an output of the first summing unit;
   a second integrator network for receiving an output of the first integrator network;
   a second summing unit connected to an output of the second integrator network;
   a third integrator network connected to an output of the second summing unit;
   a third summing unit connected to an output of the third integrator network; and
   a feed-forward path from the output of the second integrator network to an input of the third summing unit.

9. The modulator of claim 8, further comprising one of an analog-to-digital converter (ADC) or a truncator for receiving an output of the third summing unit.

10. The modulator of claim 9, further comprising a digital-to-analog converter (DAC) for receiving an output of the ADC.

11. The modulator of claim 9, further comprising a feedback path connected between an output of the one of ADC or truncator and an input of the first integrator network.

12. The modulator of claim 9, further comprising a feedback path connected between an output of the one of ADC or truncator and an input of the second integrator network.

13. A third order sigma-delta modulator, comprising:
    a first summing unit for receiving an input signal;
    a first integrator network connected to an output of the first summing unit;
    a second summing unit connected to an output of the first integrator network;
    a second integrator network connected to an output of the second summing unit;
    a third integrator network for receiving an output of the second integrator network;
    a third summing unit connected to an output of the third integrator network; and
    a feed-forward path from the output of the first integrator network to an input of the third summing unit.

14. The modulator of claim 13, further comprising one of an analog-to-digital converter (ADC) or a truncator for receiving an output of the third summing unit.

15. The modulator of claim 14, further comprising a digital-to-analog converter (DAC) for receiving an output of the ADC.

16. The modulator of claim 14, further comprising a feedback path connected between an output of the one of ADC or truncator and an input of the first integrator network.

17. The modulator of claim 14, further comprising a feedback path connected between an output of the one of ADC or truncator and an input of the second integrator network.

18. A third order sigma-delta modulator, comprising:
    a first summing unit for receiving an input signal;
    a first integrator network connected to an output of the first summing unit;
    a second summing unit connected to an output of the first integrator network;
    a second integrator network connected to an output of the second summing unit;
    a third summing unit connected to an output of the second integrator network;
    a third integrator network connected to an output of the third summing unit; and
    a feed-forward path from the output of the first summing unit to an input of the third summing unit.

19. The modulator of claim 18, further comprising one of an analog-to-digital converter (ADC) or a truncator for receiving an output of the third integrator network.

20. The modulator of claim 19, further comprising a digital-to-analog converter (DAC) for receiving an output of the ADC.

21. The modulator of claim 19, further comprising a feedback path connected between an output of the one of ADC or truncator and an input of the first integrator network.

22. The modulator of claim 19, further comprising a feedback path connected between an output of the one of ADC or truncator and an input of the second integrator network.

23. A method for modulating an input signal to produce an output digital signal, comprising:
    providing a first summing unit for receiving the input signal;
    connecting a first integrator network to an output of the first summing unit;
    providing a second integrator network for receiving an output of the first integrator network;
    connecting a second summing unit to an output of the second integrator network;

connecting a third integrator network to an output of the second summing unit; and feeding forward a modulated signal at the output of the first integrator network to an input of the second summing unit.

24. The method of claim 23, further comprising connecting one of an analog-to-digital converter (ADC) or a truncator to an output of the third integrator network.

25. The method of claim 24, further comprising feeding back a signal at an output of the one of ADC or truncator to an input of the first summing unit.

26. The method of claim 24, further comprising feeding back a signal at an output of the one of ADC or truncator to another input of the second summing unit.

27. The method of claim 23, further comprising modulating the input signal in accordance with a noise transfer function (NTF), $$NTF=(Z-1)^3/((Z-1)^3+A_3(Z-1)^2+A_1A_3C_1(Z-1)+A_1A_2A_3)$$

wherein Z is a Z-transform variable, $A_1$, $A_2$ and $A_3$ are gain factors of the first, second and third integrator networks, respectively, and $C_1$ is a gain factor of a feed-forward path from the output of the first integrator network to the input of the second summing unit.

28. The method of claim 23, further comprising connecting a third summing unit between the first integrator network and the second integrator network.

29. The method of claim 28, further comprising feeding back a signal at an output of the third integrator network to an input of the third summing unit.

30. A method for modulating an input signal to produce an output digital signal, comprising:

providing a first summing unit for receiving the input signal;

connecting a first integrator network to an output of the first summing unit;

providing a second integrator network for receiving an output of the first integrator network;

connecting a second summing unit to an output of the second integrator network;

connecting a third integrator network to an output of the second summing unit;

connecting a third summing unit to an output of the third integrator network; and feeding forward a modulated signal at the output of the second integrator network to an input of the third summing unit.

31. The method of claim 30, further comprising connecting one of an analog-to-digital converter (ADC) or a truncator to an output of the third summing unit.

32. The method of claim 31, further comprising feeding back a signal at an output of the one of ADC or truncator to an input of the first summing unit.

33. The method of claim 31, further comprising feeding back a signal at an output of the one of ADC or truncator to an input of the second summing unit.

34. The method of claim 30, further comprising modulating the input signal in accordance with a noise transfer function (NTF), $$NTF=(Z-1)^3/((Z-1)^3+A_3(Z-1)_2+A_1A_2C_1(Z-1)+A_1A_2A_3)$$

wherein Z is a Z-transform variable, $A_1$, $A_2$ and $A_3$ are gain factors of the first, second and third integrator networks, respectively, and $C_1$ is a gain factor of a feed-forward path from the output of the second integrator network to an input of the third summing unit.

35. A method for modulating an input signal to produce an output digital signal, comprising:

providing a first summing unit for receiving the input signal;

connecting a first integrator network to an output of the first summing unit;

connecting a second summing unit to an output of the first integrator network;

connecting a second integrator network to an output of the second summing unit;

providing a third integrator network for receiving an output of the second integrator network;

connecting a third summing unit to an output of the third integrator network; and feeding forward a modulated signal at the output of the first integrator network to an input of the third summing unit.

36. The method of claim 35, further comprising connecting one of an analog-to-digital converter (ADC) or a truncator to an output of the third summing unit.

37. The method of claim 36, further comprising feeding back a signal at an output of the one of ADC or truncator to an input of the first summing unit.

38. The method of claim 36, further comprising feeding back a signal at an output of the one of ADC or truncator to an input of the second summing unit.

39. The method of claim 35, further comprising modulating the input signal in accordance with a noise transfer function (NTF), $$NTF=(Z-1)^3/((Z-1)^3+A_1C_1(Z-1)^2+A_2A_3(Z-1)+A_1A_2A_3)$$

wherein Z is a Z-transform variable, $A_1$, $A_2$ and $A_3$ are gain factors of the first, second and third integrator networks, respectively, and $C_1$ is a gain factor of a feed-forward path from the output of the first integrator network to an input of the third summing unit.

40. A method for modulating an input signal to produce an output digital signal, comprising:

providing a first summing unit for receiving an input signal;

connecting a first integrator network to an output of the first summing unit;

connecting a second summing unit to an output of the first integrator network;

connecting a second integrator network to an output of the second summing unit;

connecting a third summing unit to an output of the second integrator network;

connecting a third integrator network to an output of the third summing unit; and feeding forward a modulated signal at the output of the first summing unit to an input of the third summing unit.

41. The method of claim 40, further comprising connecting one of an analog-to-digital converter (ADC) or a truncator to an output of the third integrator network.

42. The method of claim 41, further comprising feeding back a signal at an output of the one of ADC or truncator to an input of the first summing unit.

43. The method of claim 41, further comprising feeding back a signal at an output of the one of ADC or truncator to an input of the second summing unit.

44. The method of claim 40, further comprising modulating the input signal in accordance with a noise transfer function (NTF), $$NTF=(Z-1)^3/((Z-1)^3+A_3C_1(Z-1)^2+A_2A_3(Z-1)+A_1A_2A_3)$$

wherein Z is a Z-transform variable, $A_1$, $A_2$ and $A_3$ are gain factors of the first, second and third integrator networks, respectively, and $C_1$ is a gain factor of a feed-forward path from the output of the first summing unit to an input of the third summing unit.

* * * * *